(12) United States Patent
Omori et al.

(10) Patent No.: US 8,790,743 B1
(45) Date of Patent: Jul. 29, 2014

(54) METHOD FOR CONTROLLING CYCLIC PLASMA-ASSISTED PROCESS

(71) Applicant: ASM IP Holding B.V., Almere (NL)

(72) Inventors: Taku Omori, Akiruno (JP); Naoki Inoue, Hachioji (JP); Wataru Adachi, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/784,388

(22) Filed: Mar. 4, 2013

(51) Int. Cl.
*C23C 16/52* (2006.01)

(52) U.S. Cl.
CPC ...................................... *C23C 16/52* (2013.01)
USPC ...................... 427/8; 427/9; 427/10; 427/569

(58) Field of Classification Search
CPC .................. C23C 16/45523; C23C 16/45542; C23C 16/45544; C23C 16/52; H05H 1/0025; H01J 37/32146
USPC ................................................ 427/569, 8–10
See application file for complete search history.

(56) References Cited

U.S. PATENT DOCUMENTS

2006/0051520 A1* 3/2006 Behle et al. .................... 427/569
2009/0120580 A1* 5/2009 Kagoshima et al. ...... 156/345.24

OTHER PUBLICATIONS

Journal of Vacuum Science and Technology article entitled, "Optical Emission Spectroscopy As a Tool for Studying, Optimizing, and Monitoring Plasma-Assisted Atomic Layer Deposition Processes," by A. J. Mackus, S. B. Heil, E. Langereis, H. C. Knoops and M. C. van de Sanden et al., Jan./Feb. 2010, pp. 77-87.

* cited by examiner

*Primary Examiner* — Elizabeth Burkhart
(74) *Attorney, Agent, or Firm* — Snell & Wilmer L.L.P.

(57) ABSTRACT

A method for processing a substrate in a reactor by pulsing RF power, includes: applying RF power in pulses in the reactor to process the substrate; monitoring data from the reactor indicative of anomalous pulses of RF power, including data from a photo sensor equipped in the reactor; counting the number of anomalous pulses of RF power in the monitored data; determining whether or not the number of anomalous pulses of RF power is acceptable; and initiating a pre-designated sequence if the number of anomalous pulses of RF power is determined to be unacceptable.

18 Claims, 5 Drawing Sheets

METHOD FOR CONTROLLING CYCLIC PLASMA-ASSISTED PROCESS

BACKGROUND

1. Field of the Invention

The present invention generally relates to a method of processing a substrate with cyclic plasma by, e.g., plasma-enhanced atomic layer deposition (PEALD) or other low-power cyclic plasma-assisted processes, particularly to a method for controlling such processes based on plasma ignition status.

2. Description of the Related Art

In deposition of film in a PEALD reactor using low RF power, failure of plasma ignition may occur despite RF power being ON. Depending on the frequency of failure of plasma ignition, it will be difficult to obtain a film having targeted quality, resulting in generation of defective wafers. Thus, it is important to monitor the status of plasma discharge.

However, it is difficult to accurately monitor the status of plasma discharge for film deposition by PEALD or the like when plasma is charged intermittently or in pulses. Unless a proper monitoring system and parameters are established, anomalous pulses of RF power cannot accurately be detected.

For example, FIG. 1 is a schematic diagram illustrating an RF power monitoring system for a cyclic plasma-assisted reactor such as a PEALD reactor. It should be noted that any discussion of problems and solutions involved in the related art and the schematic diagram of FIG. 1 have been included in this disclosure solely for the purposes of providing a context for the present invention, and should not be taken as an admission that any or all of the discussion and the schematic diagram of FIG. 1 were known at the time the invention was made.

In FIG. 1, a main control unit (not shown), which is a controller above all, communicates with a dual chamber module controller ("DCMC") 1 using transmission control protocol and internet protocol, for example, which module controller controls process modules including a process module for controlling an RF generator. DCMC 1 communicates with an analog digital system ("ADS") 4 via a DeviceNet (a network system used in the automation industry to interconnect control devices for data exchange), for example. ADS 4, which is disposed between DCMC 1 and an I/O interface board of a reactor 3 such as a PEALD reactor or cyclic PECVD reactor, receives control commands from DCMC 1, converts digital signals of the commands to analog signals and outputs a bit sequence to respective digital out ports. ADS 4 also converts analog and digital signals from the reactor 3 and outputs them to DCMC 1. DCMC 1 outputs all analog output and digital output settings to ADS 4, and ADS 4 outputs all analog input and digital input current values to DCMC 1.

The system illustrated in FIG. 1 further comprises a programmable logic controller (PLC) logger 2 for monitoring, which receives RF signals such as RF power output, RF power ON status, RF forward power, RF reflected power, RF peak-to-peak voltage (Vpp), and RF DC bias (Vdc) from the reactor 3, and outputs, to DCMC 1, RF status indicative of whether the measured time period of RF power ON status is longer than the time period of RF power output, whether the value of RF forward power exceeds a set threshold after a set delay time elapses since the start of RF power ON, whether the value of RF reflected power exceeds a set threshold after a set delay time elapses since the start of RF power ON, whether the value of Vdc exceeds a set threshold since the start of RF power ON, and whether a difference between the timing of RF power OFF and the timing of RF forward power OFF exceeds a set value. If DCMC 1 sets an alarm which is raised according to the RF status reported from PLC logger 2, DCMC 1 raises an alarm. PLC logger 2 begins logging when DCMC 1 outputs a PLC command to start, and ends logging when DCMC 1 outputs a PLC command to end.

However, according to the system described above, it cannot accurately detect anomalous pulses of RF power such as plasma ignition failure pulses (pulses indicative of failure of plasma ignition) or cannot quantify anomalous pulses of RF power, and thus, no proper countermeasure for anomalous pulses of RF power can be set.

SUMMARY

In an embodiment of the present invention, a PLC logger or a device functionally equivalent thereto ("logging device") receives an output of a plasma photo sensor and monitors plasma luminescence intensity, which logger device is programmed to output RF status under set conditions. Accordingly, even though low RF power is used for PEALD or other cyclic processes, operation conditions can be properly evaluated by monitoring plasma status, whereby various low RF power processes can be performed without degrading film quality. Further, in an embodiment of the present invention, the logging device counts the number of anomalous pulses of RF power such as the number of plasma ignition failure pulses while RF power is activated, and a DCMC or a device functionally equivalent thereto ("module controller") is programmed to receive the RF status report from the logging device and accordingly to modify the process recipe by adding pulses, the number of which corresponds to the number of the anomalous pulses of RF power, or to abort the process, thereby minimizing the number of scrapped wafers or the like.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
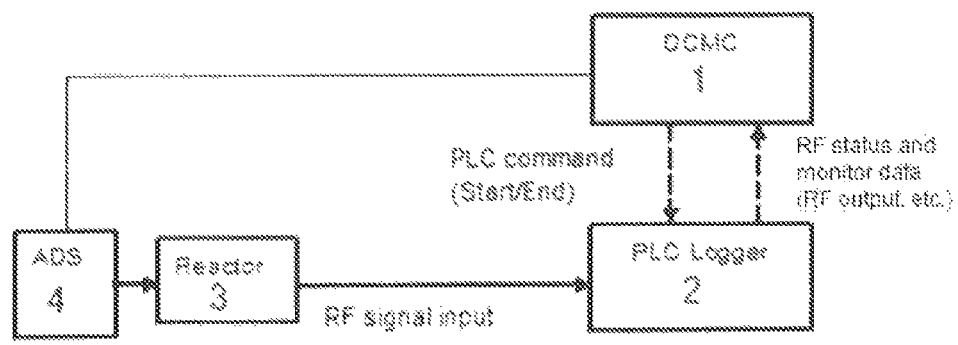
FIG. 1 is a schematic diagram illustrating an RF power monitoring system for a cyclic plasma-assisted reactor such as a PEALD reactor according to a comparative embodiment.

In this disclosure, a cyclic plasma-assisted reactor includes a PEALD reactor, a cyclic PECVD reactor, a cyclic plasma-assisted etching reactor, etc., wherein RF power is applied in the reactor in pulses to accomplish an intended process such as a process of depositing a same film or layer on a substrate, and a process of etching a same film or layer on a substrate. In some embodiments, a duration of a pulse is about 0.05 sec. to about 5.0 sec. (typically about 0.2 sec. to about 2.0 sec.), and an interval between two pulses is about 0.2 sec. to about 10 sec. (typically about 0.3 sec. to about 2.0 sec.). In some embodiments, RF power has a power of no higher than about 100 W or equivalent wattage so that the frequency of ignition failure is not negligible, although it depends upon the type, size, and configurations of the reactor, the type of the process, and the other process conditions. In some embodiments, RF power has an RF forward power of about 10 W to about 50 W (typically about 15 W). A person skilled in the art will appreciate wattage such that the frequency of ignition failure is not negligible through routine experimentation. In this disclosure, an article "a" or "an" refers to a species or a genus including multiple species. Further, in this disclosure, any two numbers of a variable can constitute a workable range of the variable as the workable range can be determined based on routine work, and any ranges indicated may include or exclude the endpoints. Additionally, any expression of values of variables indicated may refer to precise values or approximate values and include equivalents, and may refer to average, median, representative, majority, etc. in some embodiments. In the present disclosure where conditions and/or structures are not specified, the skilled artisan in the art can readily provide such conditions and/or structures, in view of the present disclosure, as a matter of routine experimentation. In this disclosure, any defined meanings do not necessarily exclude ordinary and customary meanings in some embodiments.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In some embodiments, a method for processing a substrate in a reactor by pulsing RF power, comprises: (i) applying RF power in pulses in the reactor to process the substrate; (ii) monitoring data from the reactor indicative of anomalous pulses of RF power, including data from a photo sensor equipped in the reactor; (iii) counting the number of anomalous pulses of RF power in the monitored data; (iv) determining whether or not the number of anomalous pulses of RF power is acceptable; and (v) initiating a pre-designated sequence if the number of anomalous pulses of RF power is determined to be unacceptable.

In some embodiments, the monitoring is conducted only during an ON period when RF power is applied in the reactor. In this disclosure, "RF ON", "RF power ON", and "ON period" refers to a digital signal being ON to charge RF power to electrodes in the reactor. In some embodiments, the monitoring begins at a delayed time after application of RF power begins in the ON period so as to eliminate initial fluctuation of RF power. The initial fluctuation of RF power includes a spike RF or other noise.

In some embodiments, the counting of the number of anomalous pulses of RF power includes counting the number of pulses having signals from the photo sensor being lower than a threshold, which pulses are considered to be pulses in which ignition fails. Accordingly, it is possible to quantify the effect of ignition failure. In the above, in some embodiments, the pulses of RF power are modified, without raising an alarm, by applying an additional number of pulses of RF power, which number corresponds to the number of the pulses considered to have ignition failure. Accordingly, it is possible to compensate for failure pulses of RF power so as to avoid production of damaged wafers.

In some embodiments, the data monitored include values of RF forward power, RF reflected power, self-bias voltage (Vdc), and/or peak-to-peak voltage (Vpp) measured at a matching box of an RF generator of the reactor, and plasma luminescence measured by the photo sensor. In some embodiments, the counting of the number of anomalous pulses of RF power includes counting: (a) the number of pulses of RF power whose RF forward power is lower than a threshold, the number of pulses of RF power whose RF forward power is higher than a threshold, the number of pulses of RF power whose RF reflected power is higher than a threshold, the number of pulses of RF power whose Vdc is higher than a threshold, and/or the number of pulses of RF power whose Vdc is lower than a threshold, and (b) the number of pulses of RF power whose plasma luminescence is lower than a threshold, and/or the number of pulses of RF power whose plasma luminescence is higher than a threshold.

In some embodiments, the step of initiating the pre-designated sequence is conducted only when a status report is requested. In some embodiments, the step of initiating the pre-designated sequence comprises turning on an alarm. In the above, in some embodiments, the method further comprises aborting the processing of the substrate. In some embodiments, the step of initiating the pre-designated sequence comprises modifying pulses of RF power wherein additional pulses of RF power are conducted N times wherein N is the number of pulses of RF power which is determined to be anomalous. In the above, in some embodiments, the status report is requested periodically.

In some embodiments, in the monitoring step, data sampling is conducted about every 10 to 50 milliseconds (typically about 10 milliseconds).

In some embodiments, the steps of applying RF power in pulses and initiating the pre-designated sequence are performed by a module controller, and the steps of monitoring data, counting the number of anomalous pulses of RF power, and determining are performed by a programmable logic controller logger which communicates with the module controller. The programmable logic controller (PLC) logger is a device for data logging and may be a PLC itself. The data logging file can be in any form including CSV format. The data logging can be performed in real time and continuously or periodically and communicate with the module controller in real time, in response to the request for RF status from the module controller. The module controller and the PLC logger can be programmed to perform any designated sequences disclosed herein. The module controller may be referred to as a dual chamber module controller (DCMC) for controlling a dual chamber reactor and more generally as a process module controller (PMC). The chamber to be controlled need not have a dual-chamber configuration but can have a single-chamber configuration or multiple-chamber configuration.

In some embodiments, the photo sensor is installed at a viewport formed on a side wall of the reactor and may be a Si photo diode sensing plasma luminescence, e.g., of 190 to 1,100 nm.

In some embodiments, the basic function of the logging device is monitoring anomalous pulses of RF power when RF is ON, wherein plasma luminescence occurs in pulses having a pulse duration of 0.2 to 2.0 seconds, for example, and the logging device takes in data on plasma luminescence together with a digital output (DO) of RF power (ON or OFF).

In some embodiments, the logging device can set as a parameter an upper limit and a lower limit of plasma luminescence intensity in voltage (V) transmitted from the photo sensor, and can count pulses of RF power having a plasma luminescence intensity outside the set upper and lower limits as anomalous pulses of RF power. The logging device can also turn off monitoring (although data are provided, the data are ignored). The logging device can also set a delay time for taking in data wherein the logging device ignores the data that are provided during the delay time. Accordingly, it is possible to exclude an RF spike or other noise from data for evaluating pulses of RF power. The logging device can set the number of anomalous pulses as a parameter and output an alarm signal when the number of anomalous pulses reaches the set number. The module controller receives the alarm signal and raises an alarm according to its alarm setting or can abort the process depending on the setting of a main control unit. By setting the parameters as monitoring conditions per process, an accurate monitoring system for monitoring plasma luminescence can be established.

When plasma ignition fails, the following recovery process can be performed in some embodiments. Without raising an alarm, a process recovery can be performed by using the anomalous pulse counting function of the logging device, wherein the logging device counts the number of plasma ignition failure pulses from the recipe start until the process end, wherein failure of plasma ignition can be determined based on a determining criteria using the set lower limit of plasma luminescence as a parameter. For example, when the process ends, the number of plasma ignition failure pulses is transmitted to the module controller provided with a recipe executor which performs a recovery recipe by adding the number of pulses of RF power which is the same as or equivalent to the number of plasma ignition failure pulses. When the recovery recipe is performed, parameters are set so that an alarm is set not to be raised while a standard recipe is performed.

The present invention will be explained with reference to the drawings. However, the drawings illustrate embodiments of the present invention and are not intended to limit the present invention.

Figure 2:
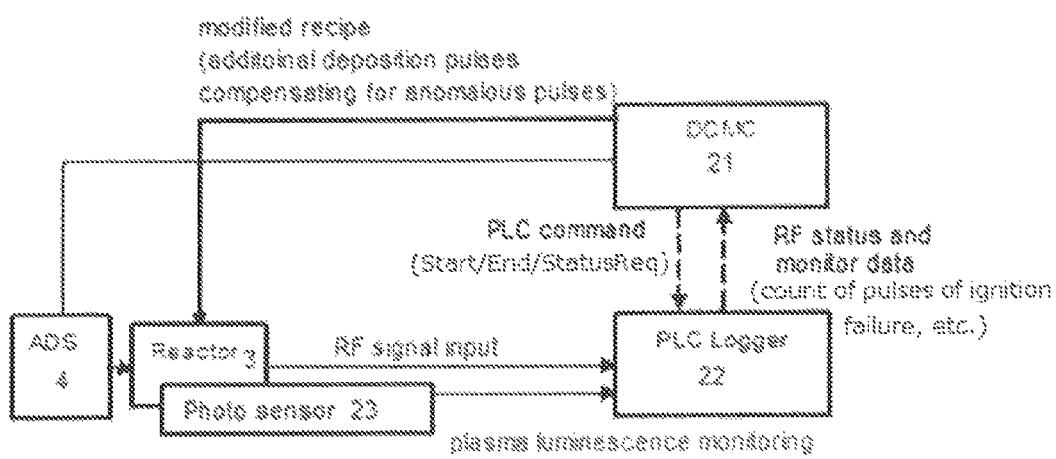
FIG. 2 is a schematic diagram illustrating an RF power monitoring system for a cyclic plasma-assisted reactor such as a PEALD reactor according to an embodiment of the present invention.

FIG. 2 is a schematic diagram illustrating an RF power monitoring system for a cyclic plasma-assisted reactor such as a PEALD reactor according to an embodiment of the present invention. The differences from the system illustrated in FIG. 1 are a photo sensor 23 is provided in the reactor 3, and PLC logger 22 and DCMC 21 receive and output signals different from those used in the system of FIG. 1. DCMC 21 outputs a PLC command to PLC logger 22, which PLC command includes not only those to start and end, but also that to request RF status. Thus, logged data can be used at any time during the process. PLC logger 22 receives plasma luminescence intensity from the photo sensor 23 in addition to RF signals such as RF power output, RF power ON status, RF forward power, RF reflected power, RF DC bias (Vdc), and RF peak-to-peak voltage (Vpp) from the reactor 3. In the above, data on Vpp are logged but are not subject to monitoring in some embodiments. PLC logger 22 receives the above RF related signals in a way similar to that of PLC logger 2 illustrated in FIG. 1; however, PLC logger 22 is programmed to process these data very differently from the way PLC logger 2 is programmed. PLC logger 22 is programmed to output, to DCMC 21, RF status indicative of the number of times when the value of RF forward power is lower than a set threshold after a set delay time elapses since the start of RF power ON, the number of times when the value of RF forward power is higher than a set threshold after a set delay time elapses since the start of RF power ON, the number of times when the value of RF reflected power is higher than a set threshold after a set delay time elapses since the start of RF power ON, the number of times when the value of Vdc is lower than a set threshold since the start of RF power ON, and the number of times when the value of Vdc is higher than a set threshold since the start of RF power ON. Further, PLC logger 22 is programmed to output, to DCMC 21, plasma luminescence status indicative of the number of times when plasma luminescence intensity is lower than a set threshold since the start of RF power ON, and the number of times when plasma luminescence intensity is higher than a set threshold since the start of RF power ON. If DCMC 21 sets an alarm which is raised according to the RF status including the plasma luminescence status reported from PLC logger 22, DCMC 21 raises an alarm.

In some embodiments, in the above, when the number of times a parameter does not satisfy the conditions set by the pre-selected threshold reaches the pre-set error count, the parameter is set in the RF status which includes the plasma luminescence status, so that DCMC 21 can raise an appropriate alarm according to the RF status.

Alternatively, for compensating for anomalous pulses of RF power without raising an alarm, DCMC 21 is programmed to perform a recovery or modified recipe by adding the number of pulses of RF power which corresponds to the number of anomalous pulses of RF power (error count) at the end of the process. DCMC 21 controls the reactor 3 directly for the recovery or modified recipe. In the above, in some embodiments, a pulse of RF power is determined to be anomalous when the plasma luminescence intensity is lower than a set threshold. The error count is reported by PLC logger 22 to DCMC 21 at the end of the process (recipe) for the recovery or modified recipe.

Figure 3:
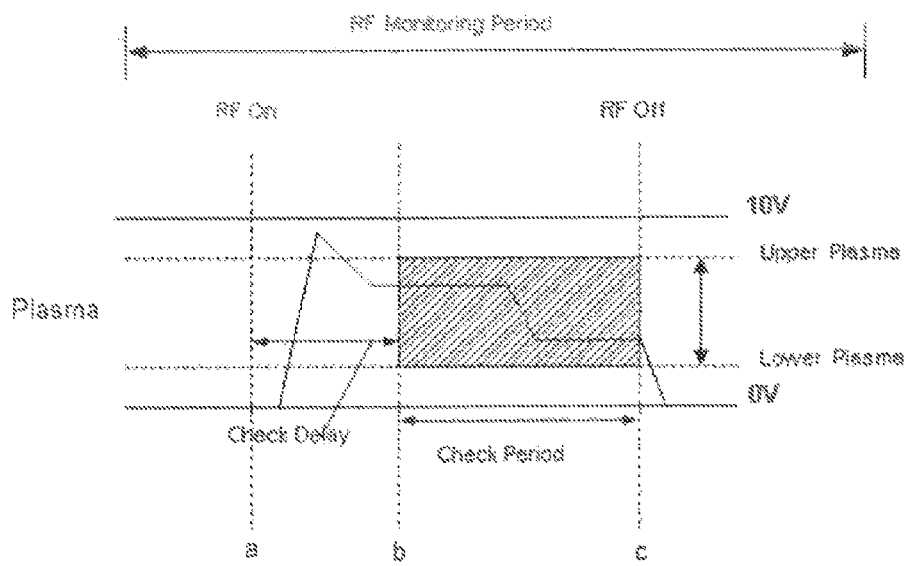
FIG. 3 is a chart illustrating a pattern of plasma luminescence intensity with time in one pulse and a reading period of plasma luminescence intensity according to an embodiment of the present invention.

FIG. 3 is a chart illustrating a pattern of plasma luminescence intensity with time in one pulse and a reading period of plasma luminescence intensity according to an embodiment of the present invention. When RF power is applied (RF is ON) at point a, plasma luminescence intensity in voltage jumps from zero to a spike voltage after point a as shown in FIG. 3. The "spike" is a sharp momentary increase in RF luminescence or a sharp rise followed by a sharp or gradual or stepped decline in RF luminescence. The duration of the spike is substantially shorter than the duration of the process in which a base power is applied. For example, the duration of the spike is about 100 msec. Typically, a peak of the spike voltage exceeds a set upper threshold ("Upper Plasma"). Reading plasma luminescence intensity begins at point b where plasma luminescence intensity becomes stable and continues until RF power is terminated (RF is OFF) at point c. After point c, plasma luminescence intensity decreases to zero quickly below a set lower threshold ("Lower Plasma"). In some embodiments, a period between point a and point b ("Delay Time") is about 0.00 sec. to about 100.00 sec. (typically, about 0.04 sec. if the period of RF ON is relatively short (e.g., about 0.05 sec.); about 0.1 sec to about 0.2 sec. if the period of RF ON has a typical length; or about 0.5 sec. to about 1.0 sec. if the period of RF ON is relatively long), and a period between point b and point c is a time period determined by deducting the period between point a and point b from the period of RF ON.

The Delay Time varies depending on the period of RF ON, for example. If the period of RF ON is short (e.g., about 0.05 sec.), the Delay Time is about 0.04 sec., meaning that data of about last 10 milliseconds are used, for example. In some embodiments where the period of RF ON is relatively long, the period between point b and point c is substantially longer than the period between point a and point b. In other embodiments where the period of RF ON is relatively short, the period between point b and point c is substantially shorter than the period between point a and point b. In the disclosure, "substantially shorter", "substantially longer", "substantially different", or the like may refer to a material difference or a difference recognized by a skilled artisan such as a ratio of 1/100, 10/100, 50/100, 90/100, or any ranges thereof in some embodiments. In this embodiment, plasma luminescence intensity can vary between 0 V to 10 V (the range of intensity is determined depending upon the type of the photo sensor, the process conditions, the configuration of the reactor, etc.). In the above, the upper limit (10 V) is a set limit where a voltage exceeding 10 V is not logged. The upper threshold may be set between about 0.00 V and about 5.00 V, and the lower threshold may set between about 0.00 V and about 5.00 V wherein when the voltage exceeds 5.5 V, for example, 5.0 V is entered in a log file. A plasma luminescence intensity lower than the lower threshold is indicative of ignition failure or plasma extinction. In some embodiments, although the upper threshold is set, it is not significant as a parameter and not used as part of the RF status.

Figure 4:
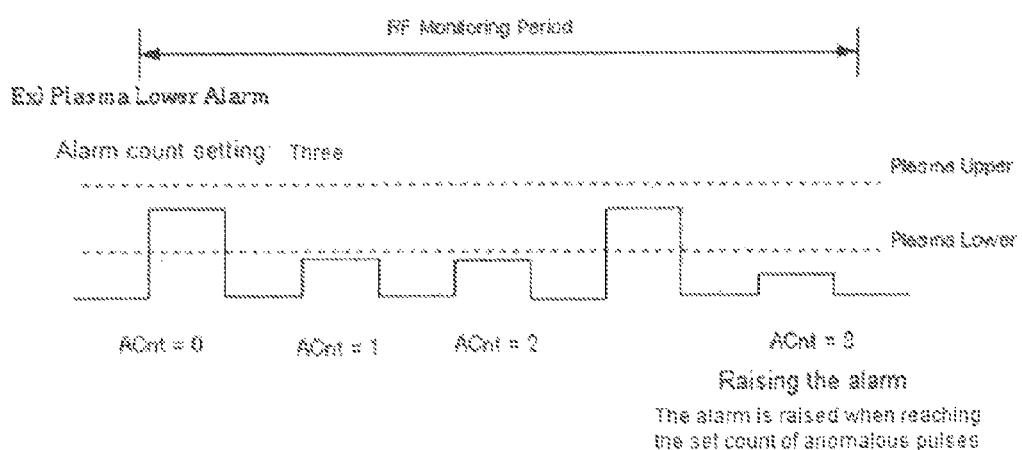
FIG. 4 is a chart illustrating a pattern of detected plasma luminescence intensity in relation to set upper and lower thresholds according to an embodiment of the present invention.

FIG. 4 is a chart illustrating a pattern of detected plasma luminescence intensity in relation to set upper and lower thresholds according to an embodiment of the present invention. In FIG. 4, changes of detected plasma luminescence intensity are simplified and each bar-like convex represents plasma luminescence intensity of one pulse of RF power between point b and point c illustrated in FIG. 3. The bar-like convex shows the lowest plasma luminescence intensity between point b and point c, even if the lowest plasma luminescence intensity lasts only for a short period of time. In the same way, the highest plasma luminescence intensity can be monitored. In FIG. 4, the number of times when plasma luminescence intensity is lower than the set lower threshold since the start of RF power ON is counted, wherein the first pulse is normal, the second pulse is anomalous, the third pulse is anomalous, the fourth pulse is normal, and the fifth pulse is anomalous. The anomalous pulses represent plasma extinction. If the logging device is programmed to transmit an alarm signal to the module controller when the number of anomalous pulses is more than three, an alarm is raised at the fifth pulse which is the third anomalous pulse.

Table 1 shows parameters indicative of anomalous pulses in an embodiment.

TABLE 1

| | Parameters | Range | Note |
|---|---|---|---|
| A) | Delay Time | 0.00-100.00 sec | A time period between RF ON and a set time, during which no reading is performed. |

TABLE 1-continued

| | Parameters | Range | Note |
|---|---|---|---|
| B) | Error Count | 0-10000 times | An alarm signal is outputted when the number of anomalous pulses reaches a set number. |
| C) | Lower Plasma | 0.00-5.00 V | A pulse having plasma luminescence intensity lower than a set value is counted as an anomalous pulse; if the set value is 0.00, no reading is performed. |
| D) | Upper Plasma | 0.00-5.00 V | A pulse having plasma luminescence intensity higher than a set value is counted as an anomalous pulse; if the set value is 0.00, no reading is performed. |

Figure 5:
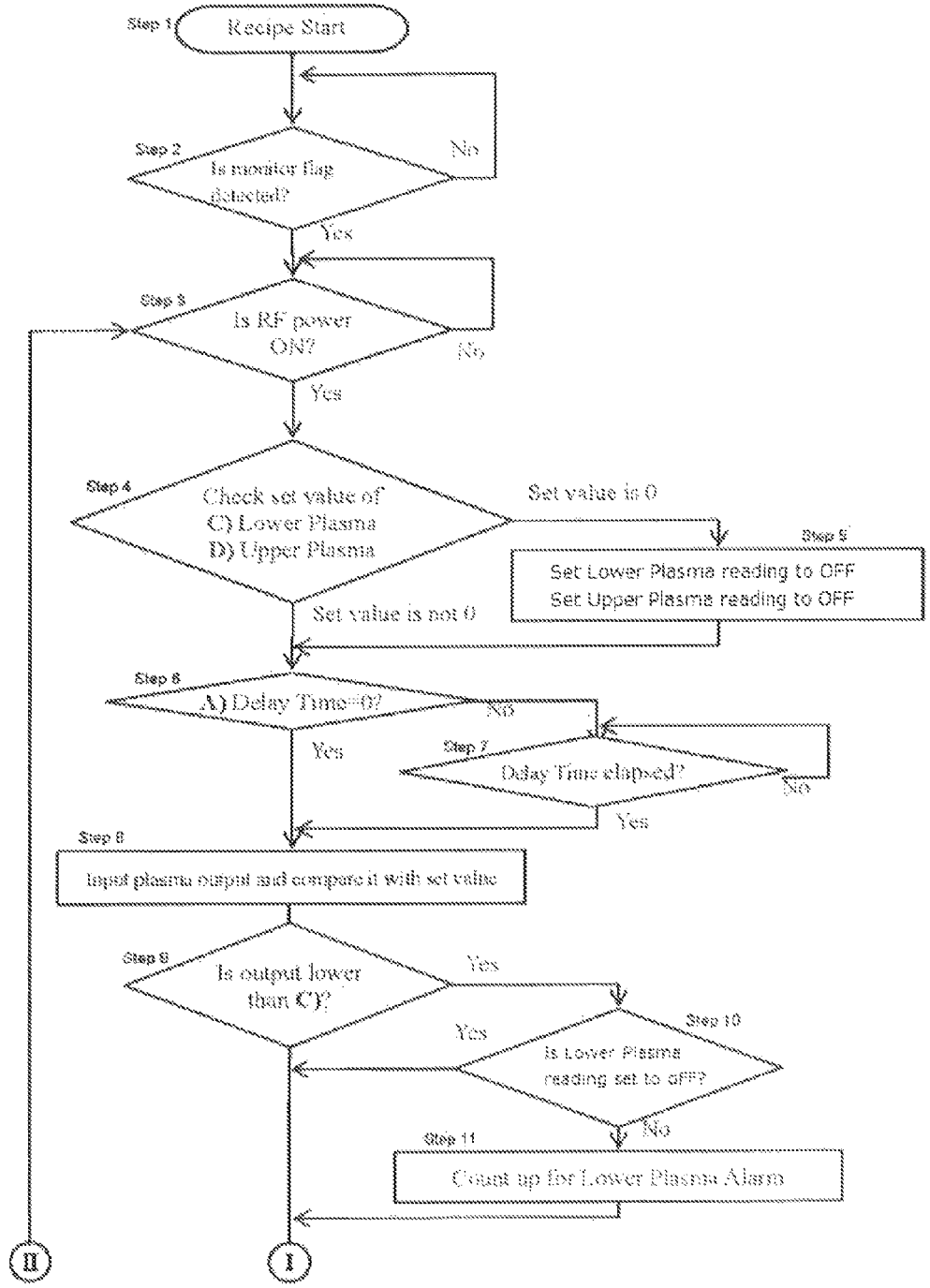
FIGS. 5 to 7 are a flowchart illustrating monitoring and operating sequences according to an embodiment of the present invention.
Figure 6:
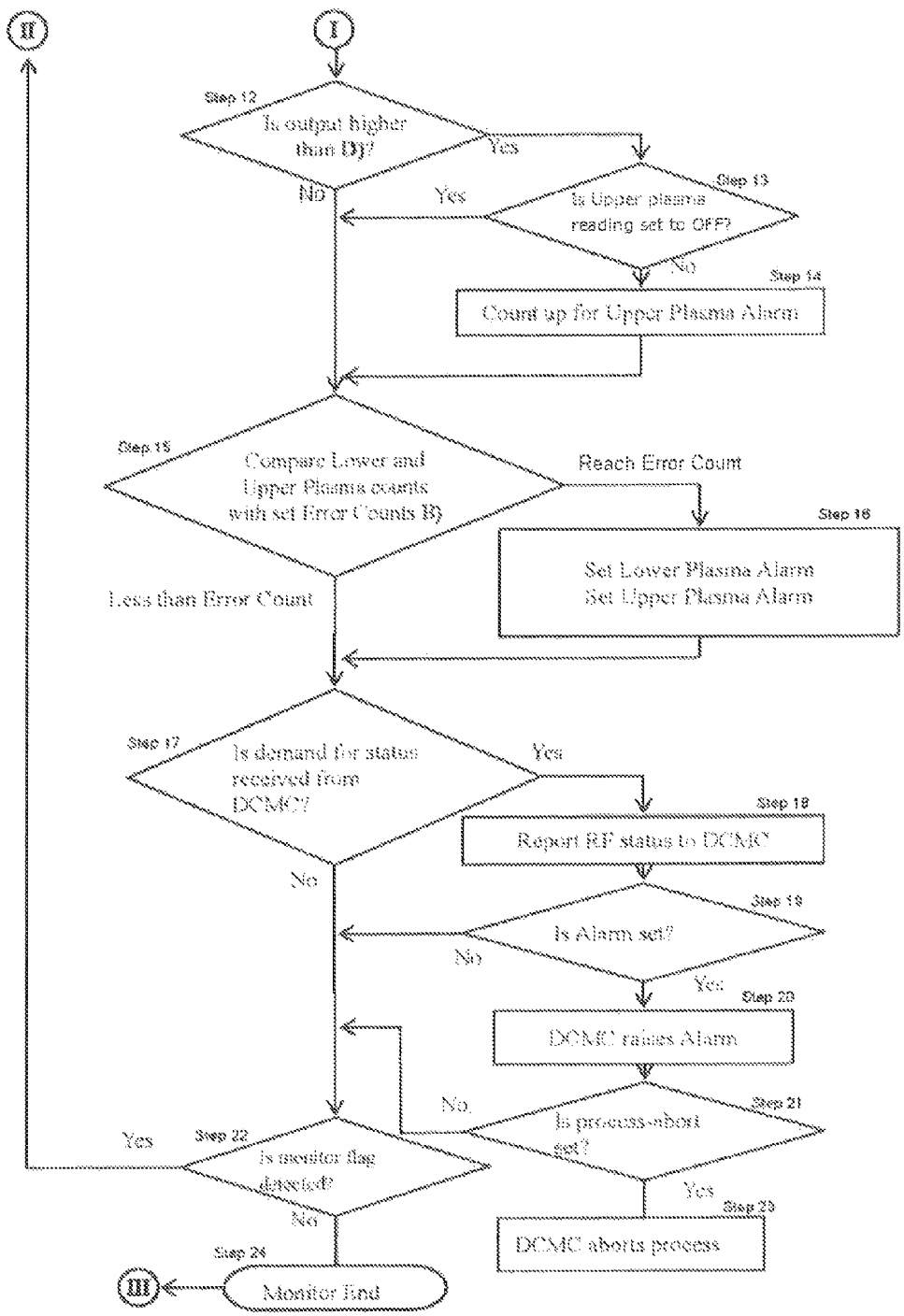
Figure 7:
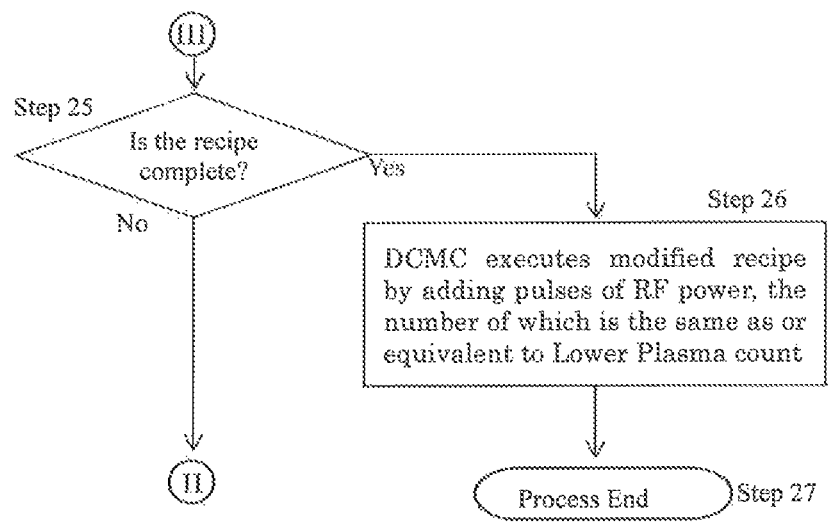

FIGS. 5 to 7 are a flowchart illustrating monitoring and operating sequences according to an embodiment of the present invention. A recipe starts in step 1. In step 2, the logging device checks if a monitor flag is detected, which is provided by the module controller. Step 2 is repeated until a monitor flag is detected. When a monitor flag is detected, the logging device checks if RF power is ON in step 3. Step 3 is repeated until RF power is ON. When RF power is ON, the logging device checks a set value of lower plasma luminescence intensity threshold ("Lower Plasma") which is parameter C) in Table 1, and a set value of upper plasma luminescence intensity threshold ("Upper Plasma") which is parameter D) in Table 1 (step 4). If the set value is zero for the lower plasma luminescence intensity threshold, then reading of plasma luminescence intensity for the lower threshold is set to be OFF, and if the set value is zero for the upper plasma luminescence intensity threshold, then reading of plasma luminescence intensity for the upper threshold is set to be OFF in step 5. If the set value is not zero, in step 6, the logging device checks if a delay time which is parameter A) in Table 1 is set at zero. If the set delay time is not zero, the logging device checks if the set delay time elapses in step 7. If the set delay time has not elapsed, step 7 is repeated until the set delay time elapses. If the set delay time elapses, the logging device reads plasma data (plasma output) including plasma luminescence intensity and compares them with the set values in step 8.

The logging device then checks if the detected plasma luminescence intensity is lower than the set value of the lower threshold (parameter C) in Table 1) in step 9. If the plasma luminescence intensity is lower than the set value of the lower threshold, in step 10, the logging device checks if the reading of plasma luminescence intensity for the lower threshold is set to be off in step 5. If the reading is set to be off, the result of the comparison (i.e., lower than the lower threshold) in step 9 is ignored. If the reading is not set to be off, the result is counted up for a lower threshold alarm signal in step 11. Next, the logging device checks if the detected plasma luminescence intensity is higher than the set value of the upper threshold (parameter D) in Table 1) in step 12. If the plasma luminescence intensity is higher than the set value of the upper threshold, in step 13, the logging device checks if the reading of plasma luminescence intensity for the upper threshold is set to be OFF in step 5. If the reading is set to be OFF, the result of the comparison (i.e., higher than the lower threshold) in step 12 is ignored. If the reading is not set to be OFF, the result is counted for an upper threshold alarm signal in step 14. The logging device then compares the detected count of the values lower than the lower threshold (Lower Plasma count) with the set error count for the lower threshold (parameter B) in Table 1), and also compares the detected count of the values higher than the upper threshold (Upper Plasma count) with the set error count for the upper threshold (parameter B) in Table 1) in step 15. If the detected count reaches the set error count for the lower threshold, or the detected count reaches the set error count for the upper threshold, the logging device sets an alarm signal for the lower threshold or the upper threshold in step 16.

Regardless of the result of step 15, the logging device then checks if it has received a demand command for RF status and monitor results from the module controller in step 17. If the logging device has received the demand command, the logging device reports the RF status and monitor results to the module controller in step 18. In some embodiments, the monitor results (monitor data) are stored in the logging device, and when the amount of data stored in the logging device reach a pre-determined amount, the logging device transfers the data to the module controller. Alternatively, the logging device transfers the data to the module controller periodically.

The module controller then checks if an alarm is set, in step 19. If an alarm is set, the module controller raises an alarm in step 20. If an alarm is not set, the module controller moves on to step 22. After step 20, the module controller checks if process-abort is set in step 21. If process-abort is set, the module controller aborts the process in step 23, and the process ends. If process-abort is not set, the module controller moves on to step 22. The logging device also moves on to step 22 if it has not received a demand command for RF status and monitor results. In step 19, if an alarm is not set, the logging device moves on to step 22. In step 22, the logging device checks if a monitor flag is detected. If a monitor flag is detected, the logging device return to step 3, followed by the above described sequence.

When the logging device receives an end command (a command to end monitoring) from the module controller in step 17, the logging device transfers the data remaining at that time to the module controller in step 18. If no alarm is set in step 19, the logging device moves on to step 22. In step 22, if no monitor flag is detected, the monitoring ends in step 24. When the monitoring ends in step 24t, and a recovery recipe is set (not shown), the module controller checks if the process (recipe) is completed in step 25 (FIG. 7). If the process is completed, the module controller performs a recovery recipe by adding pulses of RF power, the number of which is the same as or equivalent to the number of the detected anomalous pulses (typically Lower Plasma count) in step 26, and then the process ends in step 27.

In the monitoring algorithm illustrated in FIGS. 5 to 7, the lower threshold is checked, and then the upper threshold is checked. However, this order can be reversed. Further, it is possible that only one of the lower or upper threshold be checked. If the lower threshold is checked, plasma ignition failure or plasma extinction can be detected.

In the above embodiments and other embodiments, a skilled artisan will appreciate that the apparatus includes one or more controller(s) (not shown) programmed or otherwise configured to cause the above detection processes described elsewhere herein to be conducted. The controller(s) are communicated with the power sources, heating systems, pumps, robotics and gas flow controllers or valves of the reactor, as will be appreciated by the skilled artisan.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for processing a substrate in a reactor by pulsing RF power, comprising:
    applying RF power in pulses in the reactor to process the substrate;
    monitoring data from the reactor indicative of anomalous pulses of RF power, including data from a photo sensor equipped in the reactor, wherein the data monitored include values of RF forward power, RF reflected power, self-bias voltage (Vdc), and/or peak-to-peak voltage (Vpp) measured at a matching box of a RF generator of the reactor, and plasma luminescence measured by the photo sensor;
    counting the number of anomalous pulses of RF power in the monitored data, wherein the counting of the number of anomalous pulses of RF power includes counting:
        the number of pulses of RF power whose RF forward power is lower than a threshold, the number of pulses of RF power whose RF forward power is higher than a threshold, the number of pulses of RF power whose RF reflected power is higher than a threshold, the number of pulses of RF power whose Vdc is higher than a threshold, and/or the number of pulses of RF power whose Vdc is lower than a threshold, and
        the number of pulses of RF power whose plasma luminescence is lower than a threshold, and the number of pulses of RF power whose plasma luminescence is higher than a threshold;
    determining whether or not the number of anomalous pulses of RF power is acceptable; and
    initiating a pre-designated sequence if the number of anomalous pulses of RF power is determined to be unacceptable.

2. The method according to claim 1, wherein the monitoring is conducted only during an ON period when RF power is applied in the reactor.

3. The method according to claim 2, wherein the monitoring begins at a delayed time after application of RF power begins in the ON period so as to eliminate initial fluctuation of RF power.

4. The method according to claim 3, wherein the delayed time is about 0.04 seconds.

5. The method according to claim 3, wherein the delayed time is about 0.1 seconds to about 0.2 seconds.

6. The method according to claim 1, wherein the counting of the number of anomalous pulses of RF power includes counting the number of pulses having signals from the photo sensor being lower than a threshold, which pulses are considered to be pulses in which ignition fails.

7. The method according to claim 6, wherein the pulses of RF power are modified, without raising an alarm, by applying an additional number of pulses of RF power, which number corresponds to the number of the pulses considered to have ignition failure.

8. The method according to claim 1, wherein RF power has a power of no higher than 100 W.

9. The method according to claim 1, wherein a duration of a pulse of RF power is about 0.2 seconds to about 2.0 seconds.

10. The method according to claim 1, wherein in the monitoring step, data sampling is conducted about every 10 milliseconds.

11. The method according to claim 1, wherein the processing of the substrate is plasma-enhanced atomic layer deposition (PEALD) or cyclic plasma-enhanced chemical vapor deposition (cyclic PECVD).

12. The method according to claim 1, wherein the step of initiating the pre-designated sequence is conducted when a status report is requested.

13. The method according to claim 12, wherein the status report is requested periodically.

14. The method according to claim 1, wherein the step of initiating the pre-designated sequence comprises turning on an alarm.

15. The method according to claim 14, further comprising aborting the processing of the substrate.

16. The method according to claim 1, wherein the step of initiating the pre-designated sequence comprises modifying pulses of RF power wherein additional pulses of RF power are conducted N times wherein N is the number of pulses of RF power which is determined to be anomalous.

17. The method according to claim 1, wherein the steps of applying RF power in pulses and initiating the pre-designated sequence are performed by a module controller, and the steps of monitoring data, counting the number of anomalous pulses of RF power, and determining are performed by a programmable logic controller logger which communicates with the module controller.

18. The method according to claim 1, wherein the counting of the number of anomalous pulses of RF power includes counting:
the number of pulses of RF power whose RF forward power is lower than a threshold, the number of pulses of RF power whose RP forward power is higher than a threshold, the number of pulses of RF power whose RF reflected power is higher than a threshold, the number of pulses of RF power whose Vdc is higher than a threshold, and the number of pulses of RF power whose Vdc is lower than a threshold, and
the number of pulses of RF power whose plasma luminescence is lower than a threshold, and the number of pulses of RF power whose plasma luminescence is higher than a threshold.

* * * * *